(12) United States Patent
Battisti et al.

(10) Patent No.: US 9,174,480 B2
(45) Date of Patent: *Nov. 3, 2015

(54) INKJET-PRINTABLE FLEXOGRAPHY SUBSTRATE, METHOD OF MAKING, AND METHOD OF USING

(76) Inventors: Peter D. Battisti, Alpharetta, GA (US); Joseph F. Rach, Suwanee, GA (US); John P. Maneira, Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/618,507

(22) Filed: Sep. 14, 2012

(65) Prior Publication Data

US 2013/0251920 A1    Sep. 26, 2013

Related U.S. Application Data

(63) Continuation-in-part of application No. 12/895,561, filed on Sep. 30, 2010.

(51) Int. Cl.
 *B41N 1/12* (2006.01)
 *G03F 1/68* (2012.01)
 *G03F 7/20* (2006.01)

(52) U.S. Cl.
 CPC .. *B41N 1/12* (2013.01); *G03F 1/68* (2013.01); *G03F 7/2018* (2013.01); *G03F 7/2032* (2013.01); *Y10T 428/1476* (2015.01)

(58) Field of Classification Search
 CPC ............... B41N 1/12; G03F 1/68; B32B 7/12
 USPC .............................. 430/270.1, 306; 428/195.1
 See application file for complete search history.

(56) References Cited

U.S. PATENT DOCUMENTS

| 5,591,530 A * | 1/1997 | Warner et al. ................. 428/480 |
| 2003/0041962 A1 * | 3/2003 | Johnson et al. ............... 156/266 |
| 2007/0215271 A1 * | 9/2007 | McClintic ..................... 156/247 |
| 2008/0050548 A1 * | 2/2008 | Abrams ........................ 428/41.8 |

* cited by examiner

*Primary Examiner* — Chanceity Robinson
(74) *Attorney, Agent, or Firm* — Jonathan Rigdon Smith, J.D., PC; Jonathan R. Smith

(57) ABSTRACT

A flexography substrate for making I-plates with liquid photopolymers has, in addition to the tie-coat applied to one side to hold the photopolymers in place on the substrate, an adhesive layer applied to the other side. A clear release liner is applied to the adhesive layer, the adhesive layer adhering less firmly to the release liner than to the substrate. An inkjet-receptive coating is applied to the clear release liner. The masking image for the I-plate is applied to the clear release liner using an inkjet printer. After the substrate has been used to make a flexographic plate, the release liner is peeled off of the adhesive layer. The flexographic plate can then be applied to a print roll without the step of manually applying adhesive to it.

26 Claims, 7 Drawing Sheets

INKJET-PRINTABLE FLEXOGRAPHY SUBSTRATE, METHOD OF MAKING, AND METHOD OF USING

PRIORITY CLAIM

This non-provisional application for patent is a Continuation-In-Part of application Ser. No. 12/895,561, filed Sep. 30, 2010.

BACKGROUND OF THE INVENTION

Flexographic printing is a printing process which uses a flexible rubber or photopolymer relief plate, prepared with raised areas called relief areas, corresponding to an image to be printed, and surrounded by lower areas called floor areas. The plate is typically secured to a revolving drum which is contacted by an anilox roll system to coat the relief areas with ink and subsequently presses the inked areas against a moving sheet of, e.g., paper or corrugated box board. The flexible printing plates may alternatively be applied to a plate mount, e.g., hand stamps, or, potentially, non-planar surfaces other than drums.

Images for flexographic printing are typically created by using a negative of an image to mask non-image areas on a layer of photosensitive polymer ("photopolymer"). Photopolymers cure by cross-linking under exposure to ultraviolet (UV) light. The plates may be imaged digitally (what is known as computer-to-plate or CTP) or by the analog process of exposing and developing traditional film. Such films (as supplied by Kodak, Fuji, etc.) are processed into negatives via an image setter.

Another method of making negatives uses an inkjet printer to print a UV-blocking ink onto a clear plastic, e.g., polyester, material. The surface of the plastic material must be inkjet-receptive or made to be inkjet-receptive, that is, able to create an acceptably stable and detailed image, i.e., one that adheres to the plastic and dries quickly without migrating. The plastic material may be made inkjet-receptive by coating it with an inkjet-receptive coating, e.g., a micro-porous coating or a coating of inkjet-receptive polymer, or the material may be treated in some other manner such as acid etching, etc. to produce a surface that allows the ink to adhere to the film and dry quickly without migrating. The uncoated plastic material may alternatively be printed with an inkjet ink directly so long as the ink and the plastic are mutually compatible. The printed image must also have an opacity of at least about 3.0 to prevent UV curing of photopolymers during the amounts of time required to cure the exposed photopolymers.

Liquid photopolymer flexographic plates are made in an exposure unit having a horizontal bottom glass with a source of UV light below it (lower light), and a lid having a flat top glass with a source of UV light above it (upper light). A traditional flexographic plate is made in the following manner: a negative of the desired image, as prepared by one of the above methods, is placed on the bottom glass, the negative is protected by a thin optically clear film known as cover film. Liquid photopolymer is then cast over the cover film to a predetermined thickness. A substrate for supporting the photopolymer is then laminated over the liquid photopolymer. Thus a sandwich of negative, cover film, liquid polymer and substrate is created. Typically, the substrate consists of a backing sheet of photo-transmissive polymer such as polyester, with a "tie-coat" applied to one side to bond the cured photopolymer to the backing sheet. ("Substrate" as used in the remainder of this description means a laminate for supporting a cured photopolymer consisting, at least, of a polymeric backing sheet and tie-coat, and may also include a layer of adhesive and/or ink as further described below.) The substrate is placed in such a manner that the tie-coat is in direct contact with the liquid photopolymer. The sheet photopolymers (such as supplied by DuPont or the Flint Group) comprise a layer of photopolymer pre-applied to a polyester backing sheet, whereas the liquid photopolymers (such as supplied by Chemence and MacDermid) are cast over the image negative (protected by a cover film) and bond to a polyester backing sheet by the tie-coat. (Sheet photopolymers have a tie-coat pre-applied to the polyester before the photopolymer layer is added.) Sheet photopolymer material may be imaged on dual light source equipment as described above or by a single light source. In either case, the floor is first created by exposing the photopolymer through the substrate. The photographic negative is then placed on the opposite surface of the photopolymer, held in intimate contact through the application of a vacuum sheet, and imaged through it.

Precise reproduction of the negative image detail onto the photopolymer requires that the negative be placed as close to the photopolymer layer as possible. In the liquid plate-making process the bottom glass surface is grooved and etched in such a way that, when a vacuum is applied to the grooves, air is removed between the cover film and the relief image negative. In the sheet process a vacuum sheet is applied over the negative and photopolymer to remove air between the negative and the photopolymer.

Next, the UV light source in the lid (the upper light) is turned on for a prescribed amount of time to cause the photopolymer adjacent to the substrate to cross-link uniformly over the entire plate, forming the floor. The areas to be imaged are then exposed by the lower UV light (from below the bottom glass) that shines through the clear areas of the relief image negative, which causes the photosensitive polymer to cross-link, forming images that bond to the polymer floor. The (liquid) polymer that is not exposed to UV light remains in a liquid state to be later reclaimed and reused. Unexposed sheet photopolymer, by contrast, is not reusable and becomes waste.

The plate-making arrangement is then taken out of the exposure unit and the photopolymer material that has not been cured by UV light is removed from it, leaving the areas exposed to light as relief areas. When sheet photopolymers are used, a combination of solvent and mechanical action is typically used to remove the un-polymerized material from the sheet. The removed material is discarded. Un-polymerized liquid photopolymers, on the other hand, have the advantage of being reclaimable for reuse, because the un-polymerized material is not diluted by solvent or contaminated with bits of polymerized material. They can be reclaimed by draining and wiping the un-polymerized liquid off the substrate into a suitable container. Photopolymer reclaim can be accomplished manually by squeegee, by a reclaim board with rollers or by an air knife and augmented or enhanced by using heat.

Typically the floor area on such traditional flexographic plates accounts for approximately one half to two thirds of the plate thickness, and the remainder is the relief area. The floor gives dimensional stability to the plate and provides support to the relief (imaged) area. Because so much of the photopolymer is used up in making a floor that covers the entire sheet, a method of making a flexographic plate has been devised to minimize the floor area and increase significantly the reclaim of liquid photopolymer. Printing plates made from this process are called In-Position Plates, Island Plates or I-Plates. Liquid photopolymer reclaim of 20% to 35% on a traditional printing plate can be increased to 55% to 65% on an I-plate.

I-plates are made by adding another step to the process of making a traditional flexographic plate. Instead of making a floor that extends over the entire plate, a second photographic negative is placed on top of the photopolymer layer. This negative, called a masking film, is a negative that outlines the image areas on the negative with a border of one-quarter to one half inch, more or less. It is predominately black. The relief image negative and masking film are aligned so that each image area of the relief image negative is approximately in the middle of each clear area of the masking film. This prevents a floor area from being created where the masking film is black.

The most commonly-made flexographic printing plates and hand stamps are now manufactured as island plates in the following manner: the first exposure to upper UV light from the lid is through the masking negative, causing islands of cured polymer to be formed beginning in the photosensitive layer adjacent to the substrate. The timing and intensity of the exposure are limited to prevent the polymerization extending all the way through the photopolymer layer from the substrate to the free surface of the layer. The second lower UV exposure, from below the relief image negative, causes the cured detailed relief image to form on top of the islands.

Because of the placement of the second negative above the photopolymer substrate layer, the application of vacuum to remove air from between the negative and the photopolymer substrate layer is less effective than when just the substrate is used. Thus, in this prior art method for producing an I-plate, the increase in recovery of photopolymer comes at the expense of some loss of precision of the relief image. Alternatively the mask negative can be placed above the exposure glass but in this fashion distorts the resulting island formation. The "spread" in the light transmission through the thick upper glass yields an island that is larger than the negative with a broader shoulder. It is also more difficult to register the second negative to the first negative in setting up the process. This problem is solved by the substrate and method for making island plates using liquid photopolymers described in the parent application Ser. No. 12/895,561 and in the description that follows. It employs an inkjet-receptive coating applied to the surface of the backing sheet opposite to the tie-coat. This laminate of tie-coat, backing sheet, and inkjet-receptive coating, known as I-Strate™ and marketed by Chemence, Inc. of Alpharetta, Ga., U.S.A., is a substrate that enables a masking image to be applied opposite to the tie-coat using an inkjet printer. In accordance with the embodiments of the parent application, one single sheet performs the dual role of plastic backing and I-plate masking film.

OBJECTS OF THE INVENTION

Once a photopolymer relief plate is made from one of the above laminates, it is secured to the drum or plate mount by an adhesive film layer. This adhesive layer may either be hand-laminated to the polyester backing, or pre-applied to the backing and covered with a clear, flexible release liner as in the Kwikmount™ substrate marketed by Chemence, Inc. of Alpharetta, Ga., U.S.A. To use the Kwikmount™ substrate, the flexible release liner is removed to expose the adhesive layer so that the plate may be secured to the mount. I-Strate™ cannot be combined with Kwikmount™ because the inkjet-receptive coating of I-Strate™ cannot be applied on top of the adhesive layer of Kwikmount™. An object of the present invention is to provide a substrate that has the benefits of both of these technologies.

To mount a relief plate made in one of the foregoing methods in which a negative image is not printed on the substrate, as in I-Strate™, but is positioned adjacent to the substrate, it is necessary to remove the negative from the substrate and then apply adhesive. Thus, in these applications, another object of the invention is to provide a substrate upon which a negative can be formed while at the same time obviating the need to apply an adhesive layer to the substrate in a separate step.

SUMMARY OF THE INVENTION

The instant invention is a new type of flexography substrate (referred to hereinafter as "I-Strate Plus™") for use with liquid photopolymers, and the associated methods of use and making. It differs from the above-described I-Strate™ laminate and method in that the inkjet-receptive coating is not applied directly to the backing; rather adhesive is pre-applied to the backing and covered with a clear, flexible release liner, as in the Kwikmount™ system, and the inkjet-receptive coating is applied to the release liner, transforming the release liner into a surface upon which a negative can be printed. In another embodiment, the release liner itself is inkjet-receptive, and the negative is printed directly on the liner. This masking negative is removed along with the flexible release liner immediately prior to mounting the plate. I-Strate Plus™ has many of the advantages of I-Strate™ such as allowing reclaim of the uncured photopolymer to the same degree as, or better than, conventional I-plates. Like I-Strate™, I-Strate Plus™ also eliminates the second sheet of film negative so that vacuum is applied more effectively to spaces between all layers, which in turn improves the quality of both the relief and island images. Also like I-Strate, I-Strate Plus™ makes the island images easier to register with the relief image negative. A further benefit of I-Strate Plus™ is that, like Kwikmount™, I-Strate Plus™ can be mounted on a printing plate or roll without the step of applying adhesive to the flexographic plate manually.

These and other benefits will become more clearly illustrated in the following detailed description and drawings.

DETAILED DESCRIPTION OF THE INVENTION

Figure 1:
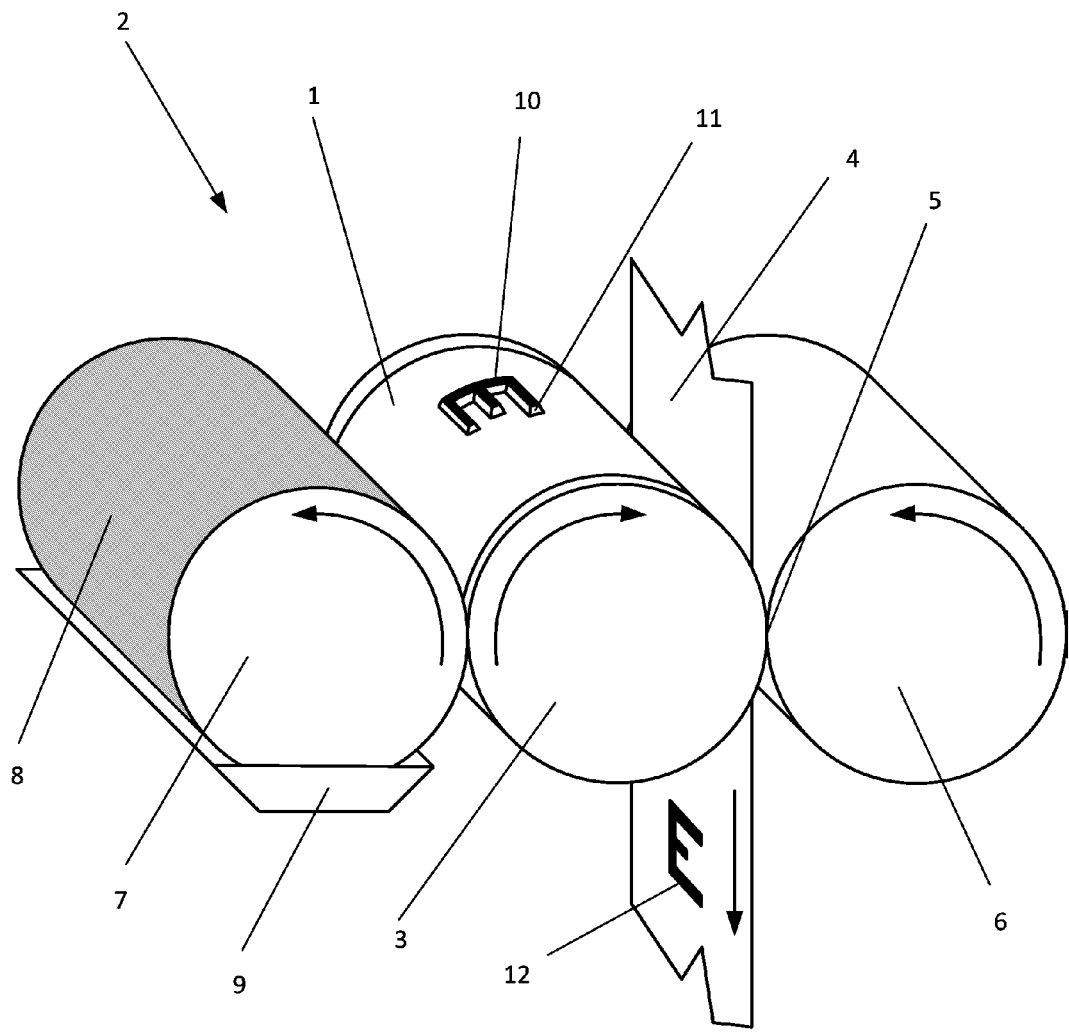
FIG. 1 is a perspective view of a flexographic plate in use on a printing machine.

Referring now to the drawings, in which like elements in the several figures are represented by like reference characters, FIG. 1 is a simplified, not-to-scale representation in perspective view of a flexographic plate 1 in use on a printing machine 2. The flexographic plate 1 (so called because it is made from flexible material, flexed into a cylindrical shape, and comprises flexible typefaces or relief faces) is fastened to cylindrical print roll 3. A sheet of printable material, e.g., paper 4, is printed by being fed through a nip 5 between the print roll 3 and a pressure roll 6. Inking roll 7 (typically an anilox roll) picks up a liquid film of ink 8 from, e.g., an ink tray 9, transferring it to the top surface 10 of a relief image 11 integral to the flexographic plate 1. The top surface 10 prints an ink image 12 on the paper.

Figure 2:
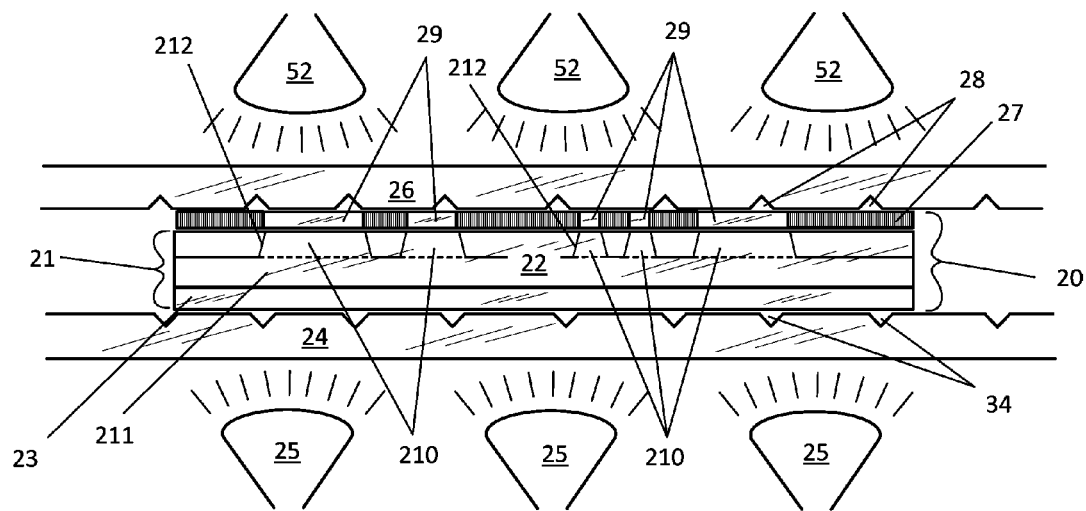
FIG. 2 is a cross-sectional illustration of a prior art method of using a sheet polymer to make a flexographic plate.

In making sheet plates the imaging negative is placed above the plate, as shown in FIG. 2. The sheet process also employs a vacuum cover (not shown) to assure intimate contact of the film to the sheet photopolymer.

FIG. 2 is a cross-sectional illustration of a prior art method of using a sheet photopolymer 21 in an arrangement of other layers 20 to make a flexographic plate. The sheet photopolymer is made up of a flexible layer of uncured photopolymer 22 affixed to a thin, flexible layer of photo-transmissive polyester, PVC, or other plastic backing 23. In this and the following figures, only the parts of the plate-making system (exposure unit) that relate to the present invention are shown. The principal parts of the plate-making system used to make a flexographic plate from the sheet photopolymer are a flat, horizontal bottom glass 24, lower UV lights 25 mounted below the bottom glass in the base of the exposure unit, and, mounted in a lid (not shown), a flat top glass 26, and upper UV lights 52. The lid (not shown) is hinged to the base of the exposure unit so that the top glass may be lowered into a horizontal position, as shown, on top of the plate-making arrangement 20 after the plate-making arrangement 20 is placed on the bottom glass 24.

After a photographic negative of the relief areas to be printed is made either by a film, digital, or inkjet method described above, the steps involved in making a traditional flexographic plate from a sheet photopolymer are:

a. Place a sheet of unexposed sheet photopolymer 21 on the bottom glass 24 with the backing 23 against the bottom glass 24;

b. Place the image negative 27 (the black areas of the negative are represented here by vertical hatching) on top of the sheet photopolymer 21;

c. cover the entire plate-making arrangement 20 with a vacuum sheet (not shown);

d. Lower the top glass 26 over the plate-making arrangement 20;

e. Turn on a vacuum source (not shown) connected to the lower vacuum grooves 34 to remove air from between the various layers;

f. Turn on the lower UV lights 25 for a prescribed amount of time to shine through the lower glass 26, causing a uniform floor layer 211 to form in the photopolymer layer 22 above the backing 23;

g. Turn on the upper UV lights 52 to shine through the clear areas 29 in the negative 27, causing vertical regions 210 the sheet photopolymer below the clear areas 29 to polymerize and bond to the floor layer 211 (at the horizontal dashed lines); and h. remove the exposed sheet photopolymer from the unit for further processing to create the relief image, namely, by mechanically removing the un-polymerized photopolymer from above the floor layer 211 by scrubbing the sheet photopolymer with solvent.

Note in this and the following figures that the lateral boundaries 212 between the exposed, polymerized photopolymer and the unexposed, un-polymerized photopolymer are inclined from the vertical by about 30 degrees, making the bases of the vertical regions 210 wider farther away from the light source than they are close to the light source. These "shoulders" form on the sides of the vertical regions 210 because the light spreads out as it passes through the photopolymer. This effect can be controlled by the shape of the light source and the thickness of the photopolymer layer, and, properly controlled, is beneficial in that it increases the dimensional stability of the vertical regions during the printing process.

As in any process where an image is formed by blocking light by interposing a mask directly over a photosensitive surface, the closer the mask is to the surface, the sharper the image formed. Application of vacuum to the grooves 28 removes air from among the imaging-related layers in the plate-making arrangement 20, thus pulling the image mask closer to the photopolymer layer. The closeness of the mask (in this case the single negative 27) to the sheet photopolymer layer 22 depends on how well the vacuum applied at the grooves 28 reaches the boundary between those two layers. The vacuum is maximally effective here because this boundary is the only one to be evacuated other than the ones that necessarily exist at the glass surfaces. In the following arrangements, more air-containing boundaries are added, thereby decreasing the effectiveness of the vacuum on any one boundary and potentially decreasing the sharpness of the image boundaries. In the sheet process the intimate contact between the photopolymer surface and the negative is achieved by use of the vacuum cover sheet, not vacuum applied to the upper vacuum grooves 28.

Figure 3:
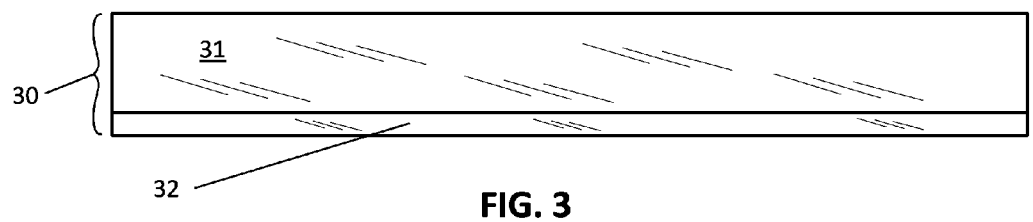
FIG. 3 is a cross-sectional view of a prior art polyester substrate for use with liquid photopolymer.

FIG. 3 is a cross-sectional view of a prior art polyester substrate 30 for use with liquid photopolymer (in contrast to the above-described sheet photopolymer, which utilizes a backing sheet pre-coated with an un-polymerized photopolymer that is basically in a solid form). The substrate 30 consists of a photo-transmissive polyester sheet 31 that has a specialized coating called a "tie-coat" 32 applied to one side. The tie-coat is necessary because cured liquid photopolymer cannot adequately bond to the backing sheet without it.

Figure 4:
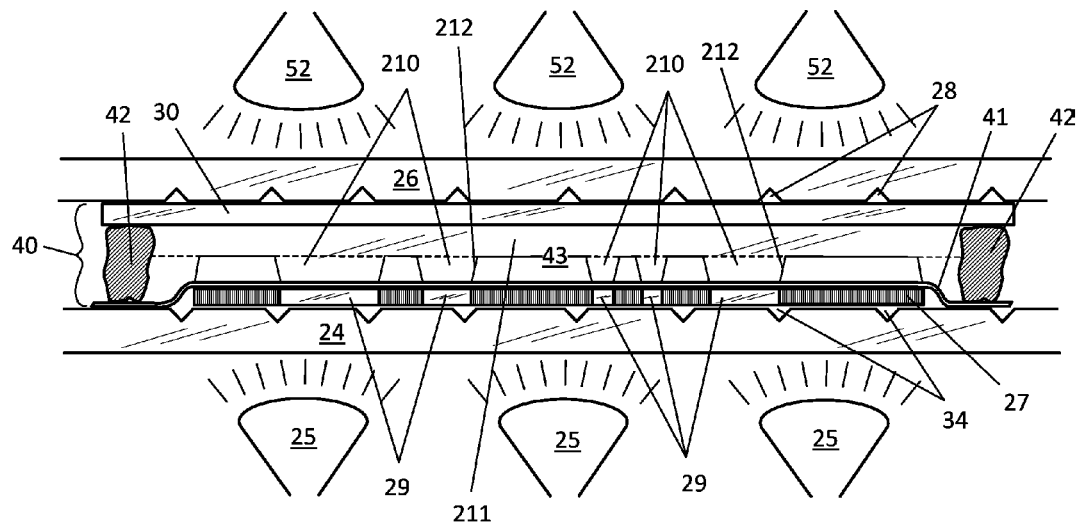
FIG. 4 is a cross-sectional illustration of a prior art method of using a liquid photopolymer to make a flexographic plate.

FIG. 4 is a cross-sectional illustration of a prior art method of using a liquid photopolymer to make a flexographic plate. An arrangement of plate-making layers 40 is assembled to make a traditional flexographic plate using a liquid photopolymer where a prior art substrate 30 is laminated to the cast liquid. The steps to accomplish this are:

a. Place the image negative 27 on the bottom glass 24;

b. Cover (protect) the negative 27 with a clear cover film 41;

c. Turn on a vacuum source (not shown) connected to the lower vacuum grooves 34 to remove air from between the bottom glass 24, the image negative 27, and the clear cover film 41;

d. Depending on the viscosity of the liquid photopolymer, nonporous damming material 42 may have to be placed around all sides of the negative 27 to control flow of liquid photopolymer over the negative by creating a shallow basin on the negative; (Dams are optional and not used in all instances. The liquid photopolymer is very viscous and does not readily flow after lamination in the process.)

e. Pour or cast liquid photopolymer 43 over the cover film 41 (within the dams 42 if applicable);

f. Apply a polyester substrate 30 over the liquid photopolymer 43 with the tie-coat side down (tie-coat not visible in this view);

g. Lower the top glass 26 over the entire plate-making arrangement 40;

h. Turn on a vacuum source (not shown) connected to the upper vacuum grooves 28 to remove air from between the substrate 30 and the upper glass 26;

i. Turn on the upper UV lights 52 for a prescribed amount of time to shine through the upper glass 26, causing a uniform floor layer 211 to form in the photopolymer layer 43 below the substrate 30;

j. Close the shutter (not shown) to prevent light reflection from the upper glass during the image exposure step;

k. Turn on the lower UV lights 25 to shine through the clear areas 29 in the negative 27, causing vertical regions 210 in the liquid photopolymer 43 above the clear areas 29 to polymerize; and l. Remove the plate-making arrangement 40 from the unit for further processing to create the relief image, namely, by turning the plate-making arrangement over, removing the cover film 41 and dams 42, and draining/collecting the un-polymerized liquid photopolymer for recycle and reuse.

Figure 5:
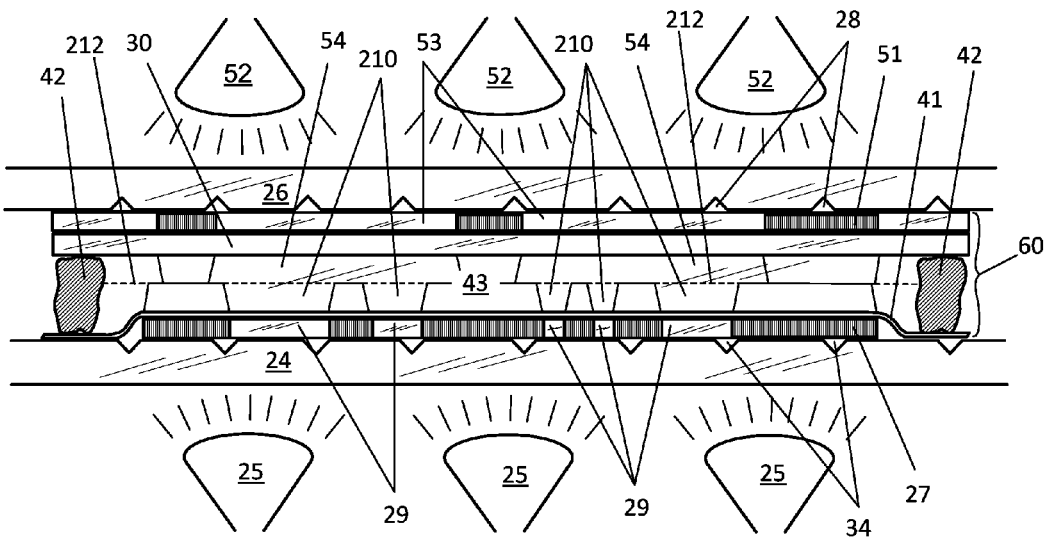
FIG. 5 is a cross-sectional illustration of a prior art method of using a liquid photopolymer to make a flexographic I-plate.

FIG. 5 is a cross-sectional illustration of a prior art method of using a liquid photopolymer to make a flexographic I-plate. A prior art plate-making arrangement 60 is assembled to make a flexographic I-plate using a liquid photopolymer where the polyester substrate 30 is laminated to the cast liquid. The steps involved are:

a. Place the relief image negative 27 on the bottom glass 24;

b. Cover (protect) the negative with a clear cover film 41;

c. Turn on a vacuum source (not shown) connected to the lower vacuum grooves 34 to remove air from between the bottom glass 24, the image negative 27, and the clear cover film 41;

d. Depending on the viscosity of the liquid photopolymer, nonporous damming material 42 may have to be placed around all sides of the negative 27 to control flow of liquid photopolymer over the negative by creating a shallow basin on the negative;

e. Pour or cast liquid photopolymer 43 over the cover film 41 (within the dams 42 if applicable);

f. Apply a polyester substrate 30 over the liquid photopolymer 43 with the tie-coat side down (tie-coat not visible in this view);

g. Place the masking film 51 on top of the polyester substrate 30 and register it so that the clear areas 53 on the masking film 51 properly surround the clear areas 29 on the image negative 27 below;

h. Lower the top glass 26 over the entire plate-making arrangement 60;

i. Turn on a vacuum source (not shown) connected to the vacuum grooves 28 to remove air from between the upper glass 26, the masking film 51, and the substrate 30;

j. Turn on the upper UV lights 52 to shine through the clear areas 53 in the masking negative 51 for a limited time, causing vertical regions 54 in the liquid photopolymer below the clear areas 53, adjacent to the polyester substrate 30, to polymerize a portion of the liquid photopolymer layer 43 to form island floor areas;

k. Close the shutter (not shown) to prevent light reflection from the upper glass during the image exposure step;

l. Turn on the lower UV lights 25 to shine through the clear areas 29 in the relief image negative 27, causing vertical regions 210 in the un-polymerized liquid photopolymer above the clear areas 29 (and below the vertical regions 54) to polymerize an additional amount of the liquid photopolymer layer 43 to form the relief image; and m. Remove the plate-making arrangement 60 from the unit for further processing to uncover the relief image, namely, by turning the plate-making arrangement over, removing the cover film 41 and dams 42, and draining/collecting the un-polymerized liquid photopolymer for recycle and reuse.

Note that this plate-making arrangement 60 adds an image-quality-reducing boundary between the masking film 51 and the polyester substrate 30 which must also be evacuated by the vacuum grooves 28. Regardless of how well the vacuum works, it is not perfect, and the masking film 51 is displaced away from the liquid photopolymer layer 43 by the thickness of the polyester substrate 30. (The boundaries between the liquid photopolymer layer 43 and the polyester substrate 30 above it and the cover film 41 below it are substantially free of air because the liquid flows against them.)

A flexographic I-plate could be made using a sheet photopolymer, but it is pointless compared to the prior art process using liquid photopolymer just discussed. There is no relative benefit, and in the process of creating islands on the sheet, the amount of polymer waste is increased, the use of solvent to process the plate is increased, and the plate processing time would be lengthened.

Figure 6:
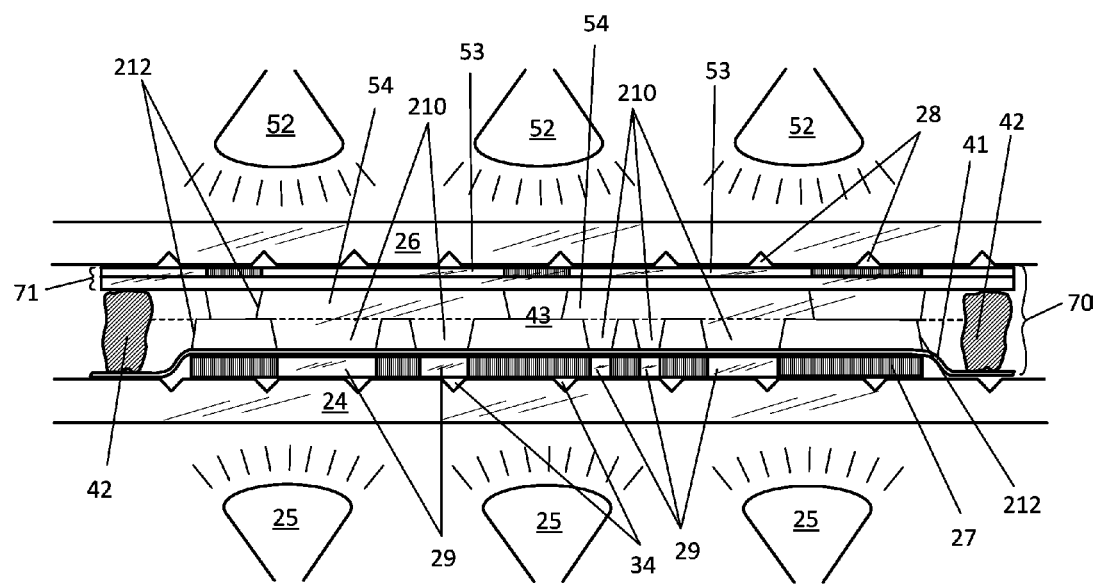
FIG. 6 is a cross-sectional illustration of the method of using an I-Strate™ substrate for making a flexographic plate using a liquid photopolymer.

FIG. 6 is a cross-sectional illustration of the method of using an I-Strate™ or I-Strate Plus™ substrate 71 for making a flexographic plate using a liquid photopolymer. A plate-making arrangement 70 is assembled for making a flexographic plate using I-Strate™ or I-Strate Plus™. The steps involved are:

a. Place the relief image negative 27 on the bottom glass 24;

b. Cover (protect) the negative with a clear cover film 41;

c. Turn on a vacuum source (not shown) connected to the lower vacuum grooves 34 to remove air from between the bottom glass 24, the relief image negative 27, and the clear cover film 41;

d. Depending on the viscosity of the liquid photopolymer, nonporous damming material 42 may have to be placed around all sides of the negative 27 to control flow of liquid photopolymer over the negative by creating a shallow basin on the negative;

e. Pour or cast liquid photopolymer 43 over the cover film 41 (within the dams 42 if applicable);

f. Print the desired island image on the inkjet-receptive side of an I-Strate™ substrate 71.

g. Apply the I-Strate™ substrate 71 over the liquid photopolymer 43 with the tie-coat 32 side down (see FIG. 7) and register it so that the clear areas 53 on the I-Strate™ substrate 71 properly surround the clear areas 29 on the image negative 27 below;

h. Lower the top glass 26 over the entire plate-making arrangement 70;

i. Turn on a vacuum source (not shown) connected to the vacuum grooves 28 to remove air from between the upper glass 26 and the I-Strate™ substrate 71;

j. Turn on the upper UV lights 52 to shine through the clear areas 53 in the I-Strate™ substrate 71 for a limited time, causing vertical regions 54 in the liquid photopolymer below the clear areas 53, adjacent to the I-Strate™ substrate 71, to polymerize a portion of the liquid photopolymer layer 43 to form island floor areas;

k. Close the shutter (not shown) to prevent light reflection from the upper glass during the image exposure step;

l. Turn on the lower UV lights 25 to shine through the clear areas 29 in the relief image negative 27, causing vertical regions 210 in the un-polymerized liquid photopolymer above the clear areas 29 (and below the vertical regions 54) to polymerize an additional amount of the liquid photopolymer layer 43 to form the relief image; and m. Remove the plate-making arrangement 70 from the unit for further processing to uncover the relief image, namely, by turning the plate-making arrangement 70 over, removing the cover film 41 and dams 42, and draining/collecting the un-polymerized liquid photopolymer off for recycle and reuse.

Note here that the use of the I-Strate™ substrate 71 eliminates the second air-containing boundary described in FIG. 5 and places the masking image in the substrate closer to the liquid photopolymer layer 43 by making it part of the substrate.

Also noteworthy here is that the use of an I-Strate™ substrate makes it easier to register the island image negative precisely against the relief image negative than is the case with a conventional, separate island image negative. This is because the I-Strate™ substrate 71 sticks to the surface of the liquid photopolymer layer rather than floating around lightly on the dry surface of a conventional substrate (note FIG. 5 step (g) above and see 51 and 30 in FIG. 5). This reduces the incidence of mis-register.

The minor steps listed above for confining the liquid and applying vacuum are conventional and may either be optional or may vary according to the equipment used for exposing the photopolymer. Thus, the necessary steps for preparing an I-plate from liquid photopolymer using a blank sheet of I-Strate™ substrate 71, starting with a digital representation of an island image and a suitable inkjet printer, are as follows:

a. Print the digital representation of the island image on the inkjet-receptive side 83 of the I-Strate™ substrate 71 using the inkjet printer;

b. Place the lower surface of the liquid photopolymer layer 43 adjacent to the relief image negative film 27 (by pouring or casting the liquid photopolymer over the protected relief image negative film as is commonly practiced);

c. Place the tie-coat 32 of the I-Strate™ substrate 71 in contact with the upper surface of the liquid photopolymer layer 43 (registering the island image properly with respect to the relief image negative);

d. Shine polymerizing light through the I-Strate™ substrate 71 for an amount of time suitable to form polymerized island floor areas 54 of a desired thickness in the liquid photopolymer in contact with the tie-coat 32; and e. Shine polymerizing light through the relief image negative 27 for an amount of time suitable to form a polymerized relief image 210 in the liquid photopolymer between the polymerized island floor areas 54 and the relief image negative 27.

Steps b. through e. apply if the I-Strate™ substrate has already been printed.

Figure 7:
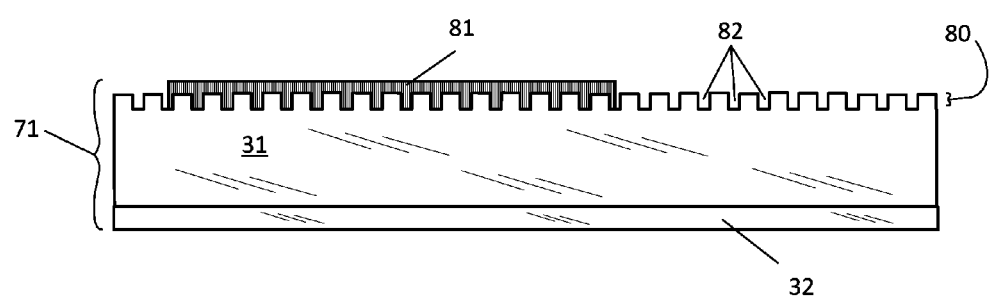
FIG. 7 is a cross-sectional view of the I-Strate™ substrate for use with liquid photopolymer.

FIG. 7 is a cross-sectional view of the I-Strate™ substrate 71 for use with liquid photopolymer. It consists of a photo-transmissive plastic backing sheet 31 that has a tie-coat 32 applied to one side, to bond with polymerized liquid photopolymer, and an inkjet-receptive surface 80 on the other side.

The inkjet-receptive surface 80 (represented here by vertical notches 82) enables inkjet ink 81 to be printed on the I-Strate™ 71 and adhere to the backing sheet 32, creating a masking negative. The inkjet-receptive surface 80 is preferably created by application of a micro-porous coating or inkjet-receptive polymer coating, but may also be created by mechanical means such as abrasion, stamping or molding, by physical means such as laser or thermal treatment, or by chemical means such as acid etching or exposure to solvent. The surface 80 itself may be inkjet-receptive depending on the chemical composition of the film surface and the composition of the ink. Thus, certain inkjet inks can be applied directly to compatible plastic sheets that are also compatible with tie-coats.

Figure 8:
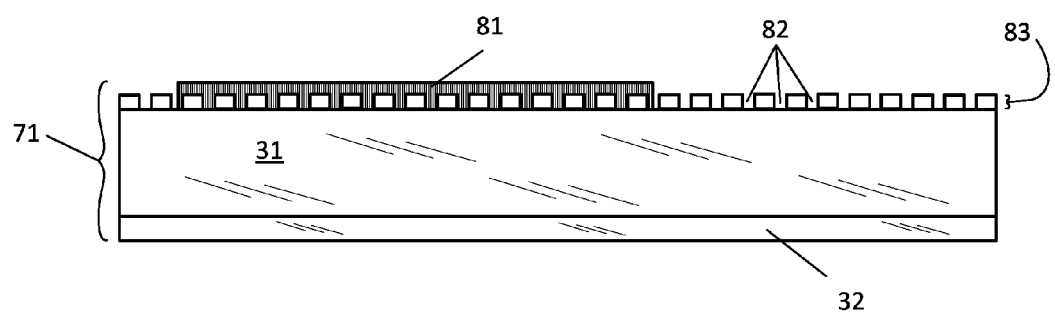
FIG. 8 is a cross-sectional view of the preferred embodiment of the I-Strate™ substrate for use with liquid photopolymer.

FIG. 8 is a cross-sectional view of the preferred embodiment of the I-Strate™ substrate 71 for use with liquid photopolymer, consisting of a photo-transmissive polyester backing sheet 31 that has a tie-coat 32 applied to one side, to bond with polymerized liquid photopolymer, and an inkjet-receptive polymeric coating 83 applied to the other side. Like the micro-porous surface 80 in FIG. 7, the polymeric coating 83 also enables inkjet ink 81 to be printed on the I-Strate™ 71 and adhere to the backing sheet 32, creating a masking negative. At the present time, the preferred inkjet-receptive coating is a water-based polymer coating formulated to hold water-based inkjet inks. (Such inks currently produce smaller ink droplets than non-aqueous inks and are thus capable of producing finer images.) Thus, the preferred embodiment of I-Strate™ is a flexible sheet of clear polyester 31 with a tie-coat 32, compatible with the liquid photopolymer, applied to one side, and a coating 83, compatible with water-based inkjet ink, applied to the other side.

Figure 9:
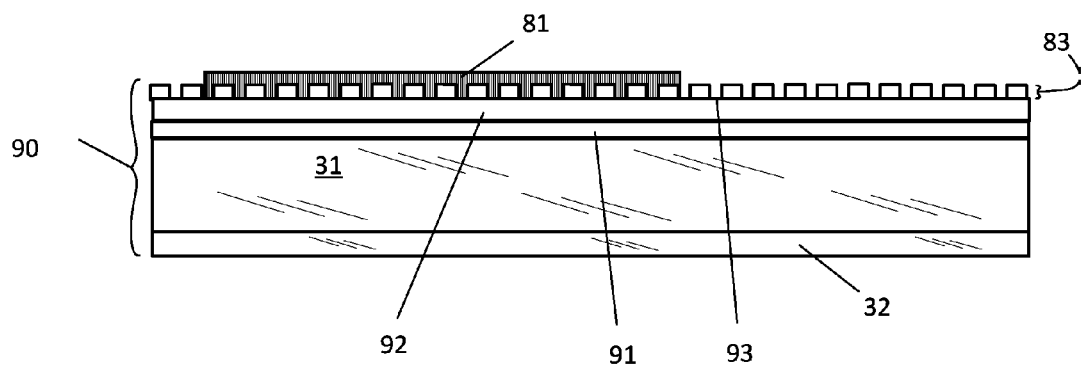
FIG. 9 is a cross-sectional view of the preferred embodiment of the I-Strate Plus™ substrate for use with liquid photopolymer.

FIG. 9 is a cross-sectional view of the preferred embodiment of I-Strate Plus™ substrate 90, for use with liquid photopolymer, also illustrating the preferred method of making it. As in I-Strate™, it consists of a photo-transmissive backing sheet 31 with a tie-coat 32 applied to one side. In this embodiment, however, a pressure sensitive adhesive coating 91 has been applied to the other side. The pressure sensitive adhesive coating 91 is covered with a clear plastic release liner 92 to which an inkjet-receptive coating 83 is then applied. An interface 93 is shown between the liner 92 and the coating 83.

Thus, the preferred method of making this embodiment is:

a. Apply a tie-coat 32 to a backing sheet 31;

b. Apply an adhesive coating 91 to at least a portion of the backing sheet 31 on the side opposite to the tie-coat 32;

c. Cover the adhesive coating 91 with a clear plastic release liner 92; and d. Apply an inkjet-receptive coating 83 to the free surface of the plastic release liner 92.

Once this substrate has been prepared, a portion of it is trimmed to the desired size for preparing a flexography plate, and an island image 81 is printed on the inkjet-receptive coating 83 using, e.g., an inkjet printer.

A second method of making the I-Strate Plus™ substrate 90 is to apply the inkjet-receptive coating 83 to a plastic release liner 92, apply an adhesive coat 91 to one side of a backing sheet 31, and then apply the uncoated side of the plastic release liner 92 to the adhesive-coated side of the backing sheet 31.

Thus, a second method of the present invention for making an I-Strate Plus™ substrate 90 is:

a. Apply an inkjet-receptive coating 83 to a plastic release liner 92;

b. Apply a tie-coat 32 to a backing sheet 31;

c. Apply an adhesive coat 91 to one side of a backing sheet 31; and d. Apply the uncoated side of the plastic release liner 92 to the adhesive coat 91.

Once this substrate has been prepared, a portion of it is trimmed to the desired size for preparing a flexography plate and printed as described above.

A third method of the present invention for making an I-Strate Plus™ substrate 90 is to print the island image on the release liner before the release liner is applied to the adhesive coat. This method requires the use of a release liner material that is dimensionally stable so that the image printed on it is not distorted during application to the adhesive coat. This method (not illustrated in the drawings) for making an I-Strate Plus™ substrate 90 with an island image 81 printed on it is:

a. Apply the inkjet-receptive coating 83 to a plastic release liner 92;
   b. Print the island image 81 on the inkjet-receptive coating 83;
   c. Apply the tie-coat 32 to one side of the backing sheet 31;
   d. Apply the adhesive coat 91 to the opposing surface of the backing sheet 31; and
   e. Apply the unprinted surface of the release liner 92 to the adhesive coat 91.

It can be advantageous to apply the coating 91 so as not to completely cover the backing sheet 31. If the coating 91 is applied to the entire surface of the backing sheet opposite the tie-coat side, air bubbles can, and usually do, get trapped between the i-plate and the print roll when the I-plate is mounted on the roll. If the air bubbles are large enough, they can cause uneven printing because they cause variations in the height of the relief image above the surface of the roll. To prevent this, the technician placing the plate on the roll has to take extra time putting the plate on the roll to eliminate bubbles and/or popping the bubbles after the plate is affixed to the roll. However, if the coating 91 is applied in strips or other patterns, the size and number of air bubbles that may become trapped between the finished I-plate and the print roll is less and time is saved in fixing the plate to the print roll. Therefore, this invention includes in its scope covering less than the entire surface of the backing sheet with adhesive (but at least a portion of it, as claimed).

Figure 10:
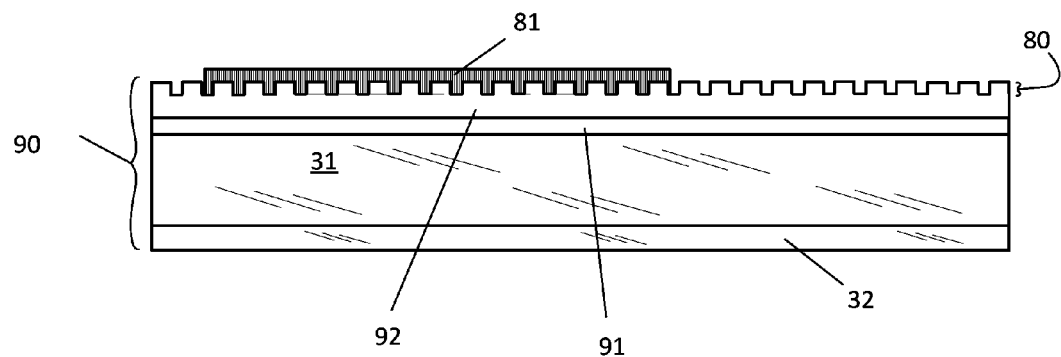
FIG. 10 is a cross-sectional view of a second embodiment of the I-Strate Plus™ substrate for use with liquid photopolymer.

FIG. 10 is a cross-sectional view of a second embodiment of I-Strate Plus™ substrate 90, for use with liquid photopolymer, similar to the preferred embodiment with the difference being that the clear plastic release liner itself is inkjet-receptive. This is equivalent to removing the interface between the inkjet-receptive coating 83 (see FIG. 9) and the release liner 92, so that the release liner 92 has an inkjet receptive surface 80.

The methods of making this second embodiment differ from the above methods of making the preferred embodiment simply by removing the step of applying an inkjet-receptive coating.

Figure 11:
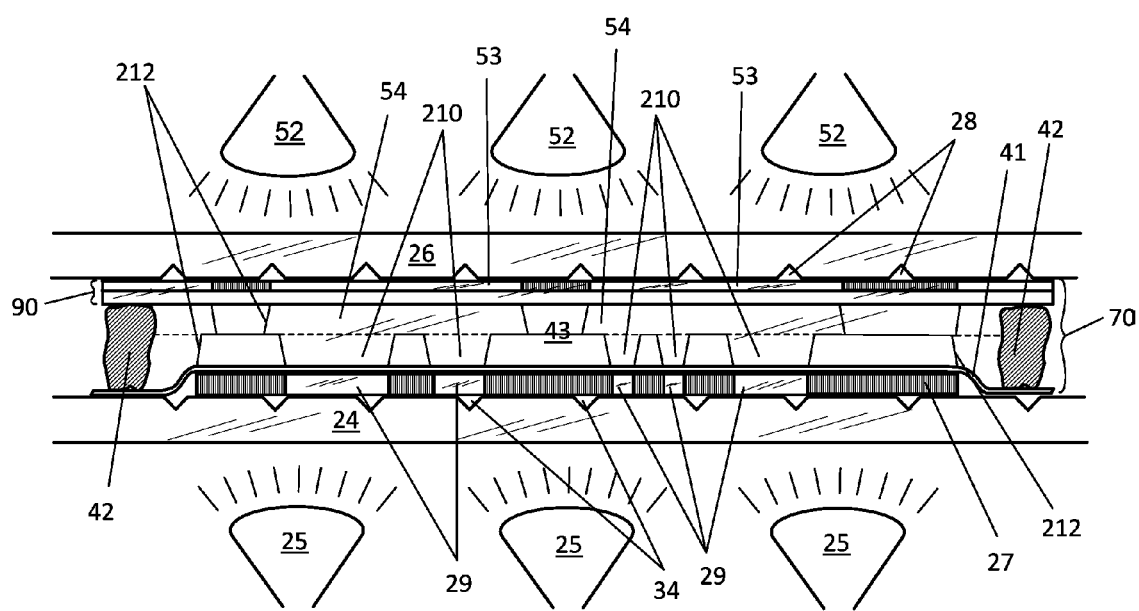
FIG. 11 is a cross-sectional illustration of the method for using an I-Strate Plus™ substrate for making a flexographic I-plate using a liquid photopolymer.

FIG. 11 is a cross-sectional illustration of the method for using an I-Strate Plus™ substrate 90 for making a flexographic I-plate using a liquid photopolymer. The necessary steps for preparing an I-plate from liquid photopolymer starting with an unprinted sheet of I-Strate Plus™ substrate 90 are as follows:

a. Print the digital representation of the island image 81 on the inkjet-receptive side 83 of the I-Strate Plus™ substrate 90 (see FIG. 9) using a suitable inkjet printer;
   b. Place the relief image negative film 27 on the bottom glass 24 of the UV exposure unit;
   c. Place the lower surface of the liquid photopolymer layer 43 adjacent to the relief image negative film 27 (by pouring or casting the liquid photopolymer over the protected relief image negative film as is commonly practiced);
   d. Place the tie-coat 32 of the I-Strate Plus™ substrate 90 in contact with the upper surface of the liquid photopolymer layer 43 (registering the island image properly with respect to the relief image negative);
   e. Shine polymerizing light through the I-Strate Plus™ substrate 90 for an amount of time suitable to form polymerized island floor areas 54 of a desired thickness in the liquid photopolymer in contact with the tie-coat 32; and
   f. Shine polymerizing light through the relief image negative 27 for an amount of time suitable to form a polymerized relief image 210 in the liquid photopolymer between the polymerized island floor areas 54 and the relief image negative 27.

Figure 12:
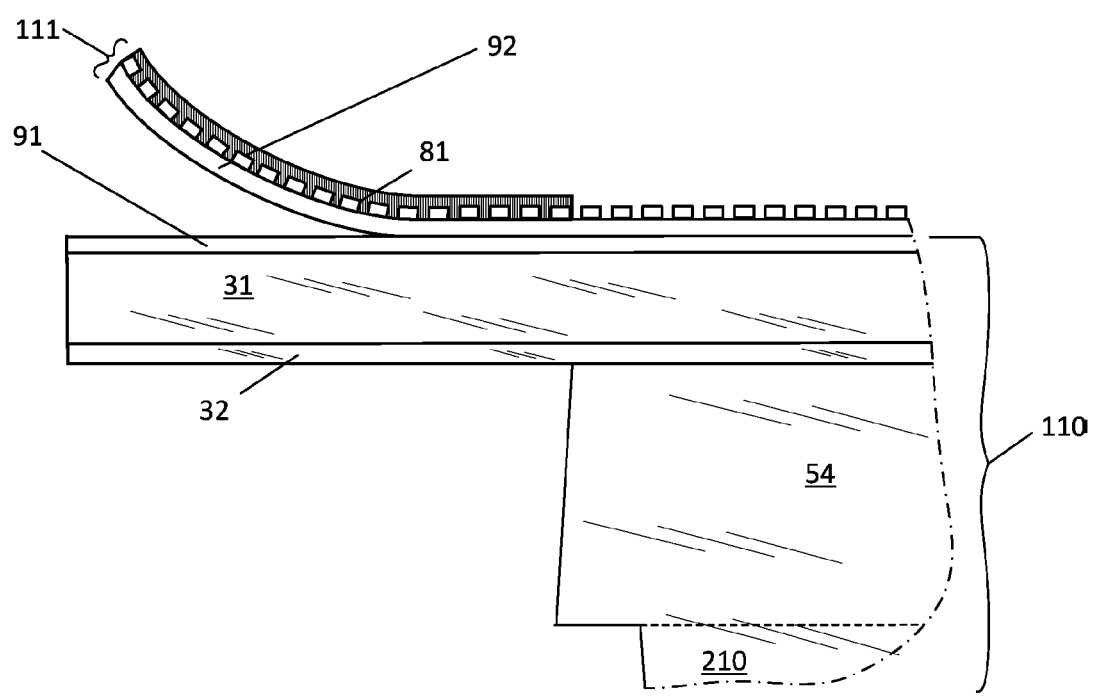
FIG. 12 is a cross-sectional illustration showing removal of the printed release liner from the finished flexographic printing plate.

FIG. 12 is a cross-sectional illustration showing the additional steps of removal of the exposed laminate of the preferred embodiment (see FIG. 9) from the exposure unit. After exposure is complete, the polymerized island and relief images 54 and 210 respectively are cleaned and cured and the printed release liner 111 is peeled off of the laminate, leaving the finished flexographic printing plate 110 with the adhesive layer 91 exposed.

The scope of this invention includes not only polyester as a photo-transmissive plastic backing sheet but other photo-transmissive materials such as polycarbonate, in combination with compatible tie-coats and inkjet-receptive surfaces and coatings, with the only limitation being that they must be compatible with the chosen liquid photopolymers and inkjet inks.

In summary, with the present invention, a single sheet of printed I-Strate Plus™ substrate performs the triple role of I-plate masking film, substrate, and adhesive for bonding the flexographic printing plate to the mount. In doing so it conserves resources by eliminating a sheet of film, reducing the amount of off-quality product, and increasing the recycle of photopolymer; it improves the quality of the printed image by placing the image negative closer to the photopolymer layer during exposure to UV light; it increases the strength of the plate by improving the adhesion of the cured polymer to the tie-coat; and it increases the speed of the entire process by both increasing the rate of polymerization of the polymers during UV exposure and eliminating the requirement of manually applying adhesive to the plate.

The invention claimed is:

1. A flexography substrate, comprising:
a flexible backing sheet comprising a first substance and having a first surface and a parallel second surface;
a tie-coat bonded to the first surface and an adhesive layer bonded to the second surface;
   the adhesive layer covering a portion of the second surface;
a flexible release liner comprising a second substance and having a third surface and a parallel fourth surface;
   the third surface applied to the adhesive layer;
   the fourth surface comprising a material that is inkjet ink-receptive; and
a layer of photopolymer applied to the tie-coat.

2. The flexography substrate of claim 1, wherein:
said material of said fourth surface comprises said second substance.

3. The flexography substrate of claim 1, wherein:
said material of said fourth surface comprises a coating applied to said fourth surface.

4. The flexography substrate of claim 2, wherein:
said second substance comprises either
(a) an inkjet ink-receptive polymer, or
(b) a micro-porous coating.

5. The flexography substrate of claim 3, further comprising:
a printed image of inkjet ink on said material.

6. The flexography substrate of claim 5, in which:
said printed image has a minimum opacity of about 3.0 when dry.

7. A method of making the flexography substrate of claim 5, comprising the steps of:
(a) applying said tie-coat to said first surface and said adhesive layer to said second surface, in either order,
(b) applying said third surface to said adhesive layer,
(c) applying said coating to said fourth surface,
(d) applying said printed image on said coating, and
(e) applying said layer of photopolymer to said tie-coat.

8. The method of claim 7, in which:
steps (c) and (d) are performed before step (a).

9. A method of making the flexography substrate of claim 5, comprising the steps of:
(a) applying said tie-coat to said first surface and said adhesive layer to said second surface, in either order,
(b) applying said third surface to said adhesive layer,
(c) applying said printed image on said fourth surface, and
(d) applying said layer of photopolymer to said tie-coat.

10. The method of claim 9, in which:
steps (b) and (c) are performed before step (a).

11. A method of making a flexographic I-plate on a UV exposure unit, comprising the steps of:
(a) obtaining a flexible backing sheet comprising a first substance and having a first surface and a parallel second surface;
a tie-coat bonded to the first surface and an adhesive layer bonded to the second surface;
the adhesive layer covering a portion of the second surface;
a flexible release liner comprising a second substance and having a third surface and a parallel fourth surface;
the third surface applied to the adhesive layer;
the fourth surface comprising a material that is inkjet ink-receptive;
(b) printing an image on the fourth surface;
(c) placing a relief image negative on the bottom glass of the UV exposure unit;
(d) placing a layer of liquid photopolymer adjacent to the relief image negative;
(e) placing the tie-coat in contact with the upper surface of the liquid photopolymer layer;
(f) shining polymerizing light through the layers created in steps (a) through (e) to form polymerized island floor areas in the layer of liquid photopolymer and bond them to the tie-coat; and
(g) shining polymerizing light through the relief image negative to form a polymerized relief image in the layer of liquid photopolymer between the polymerized island floor areas and the relief image negative and bonded to the floor areas.

12. The method of claim 11, comprising the additional steps of:
(h) removing the materials processed in steps (a) through (g) from the UV exposure unit;
(i) removing un-polymerized liquid photopolymer from the materials and curing said polymerized island floor areas and said relief image; and
(j) removing said flexible release liner from said adhesive layer.

13. A method of making a flexographic I-plate on a UV exposure unit, comprising the steps of:
(a) obtaining a flexible backing sheet comprising a first substance and having a first surface and a parallel second surface;
a tie-coat bonded to the first surface and an adhesive layer bonded to the second surface;
the adhesive layer covering a portion of the second surface;
a flexible release liner comprising a second substance;
the second substance comprising either:
(1) an inkjet ink-receptive polymer, or
(2) a micro-porous coating:
the flexible release liner having a third surface and a parallel fourth surface;
the third surface applied to the adhesive layer;
the fourth surface comprising a material that is inkjet ink-receptive;
(b) printing an image on the fourth surface;
(c) placing a relief image negative on the bottom glass of the UV exposure unit;
(d) placing a layer of liquid photopolymer adjacent to the relief image negative;
(e) placing the tie-coat in contact with the upper surface of the liquid photopolymer layer;
(f) shining polymerizing light through the layers created in steps (a) through (e) to form polymerized island floor areas in the layer of liquid photopolymer and bond them to the tie-coat; and
(g) shining polymerizing light through the relief image negative to form a polymerized relief image in the layer of liquid photopolymer between the polymerized island floor areas and the relief image negative and bonded to the floor areas.

14. The method of claim 13, comprising the additional steps of:
(h) removing the materials processed in steps (a) through (g) from the UV exposure unit;
(i) removing un-polymerized liquid photopolymer from the materials and curing said polymerized island floor areas and said relief image; and
(j) removing said flexible release liner from said adhesive layer.

15. A flexography substrate, comprising:
a flexible backing sheet comprising a first substance and having one surface and an opposing surface;
a flexible backing sheet having a tie-coat bonded to one surface and an adhesive layer bonded to the opposing surface;
the adhesive layer covering a portion of the opposing surface of the flexible backing sheet;
a flexible release liner comprising a second substance and having a first surface applied to the adhesive layer;
a second surface comprising a material that is inkjet ink-receptive; and
a layer of photopolymer applied to the tie-coat.

16. The flexography substrate of claim 15, wherein:
said material of said second surface is said second substance.

17. The flexography substrate of claim 15, wherein:
said material of said second surface is a coating applied to said second surface.

18. The flexography substrate of claim 17, wherein:
said coating applied to said second surface is taken from the list of:
(a) an inkjet ink-receptive polymer, and
(b) a micro-porous coating.

19. The flexography substrate of claim 17, further comprising:
a printed image of inkjet ink on said material.

20. The flexography substrate of claim 18, in which:
said coating is a water-based coating compatible with water-based inkjet inks.

21. The flexography substrate of claim 20, in which:
said flexible backing sheet is UV-transparent plastic.

22. The flexography substrate of claim 21, in which:
said plastic is polyester.

23. The flexography substrate of claim 3, in which:
said coating is a water-based coating compatible with water-based inkjet inks.

24. The flexography substrate of claim 3, in which:
said flexible backing sheet is UV-transparent plastic.

25. The flexography substrate of claim 24, in which:
said plastic is polyester.

26. The flexography substrate of claim 19, wherein:
said image has a minimum opacity of about 3.0.

* * * * *